US012369282B2

(12) United States Patent
Chen et al.

(10) Patent No.: US 12,369,282 B2
(45) Date of Patent: Jul. 22, 2025

(54) LIQUID COOLING RACK ASSEMBLY FOR COMPUTING SYSTEM AND TELECOMMUNICATION SYSTEM INCLUDING THE SAME

(71) Applicant: Quanta Computer Inc., Taoyuan (TW)

(72) Inventors: Chao-Jung Chen, Taoyuan (TW); Ta-Chih Chen, Taoyuan (TW); Chih-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 216 days.

(21) Appl. No.: 18/242,379

(22) Filed: Sep. 5, 2023

(65) Prior Publication Data

US 2025/0040100 A1    Jan. 30, 2025

Related U.S. Application Data

(60) Provisional application No. 63/515,771, filed on Jul. 26, 2023.

(51) Int. Cl.
*H05K 7/20* (2006.01)
*H05K 7/18* (2006.01)

(52) U.S. Cl.
CPC .......... *H05K 7/20781* (2013.01); *H05K 7/186* (2013.01); *H05K 7/20836* (2013.01)

(58) Field of Classification Search
CPC ........... H05K 7/20781; H05K 7/20272; H05K 7/1489; H05K 7/20763; H05K 7/2079;

(Continued)

(56) References Cited

U.S. PATENT DOCUMENTS 10,925,190 B2 * 2/2021 Gao .................. H05K 7/20254
2006/0126296 A1 * 6/2006 Campbell ............ H05K 7/2079
361/700

(Continued)

FOREIGN PATENT DOCUMENTS

| CN | 100556260 C | 10/2009 |
| TW | 201633881 A | 9/2016 |
| TW | I761710 B | 4/2022 |

OTHER PUBLICATIONS

TW Office Action for Application No. 112139361 mailed Jul. 15, 2024, w/ First Office Action Summary, 7 pp.

(Continued)

*Primary Examiner* — Mandeep S Buttar
(74) *Attorney, Agent, or Firm* — NIXON PEABODY LLP

(57) ABSTRACT

A liquid cooling rack assembly for a computing system includes a first cabinet rack configured to receive within a plurality of computing devices with heat-generating electronic components; and a second cabinet rack configured to receive coolant components. The second cabinet rack has a plurality of movable trays, each tray of the plurality of movable trays being movable generally horizontally and independently of other trays of the plurality of movable trays. The liquid cooling rack assembly further includes a plurality of cooling pumps. Each pump of the plurality of cooling pumps is placed on a respective one of the plurality of movable trays, and each pump is independently serviceable from other pumps of the plurality of cooling pumps based on independent movement of a respective tray.

20 Claims, 8 Drawing Sheets

(58) Field of Classification Search
CPC ............. H05K 7/20627; H05K 7/1457; H05K 7/1487; H05K 7/1488; H05K 7/20; H05K 7/20327; G06F 1/20; G06F 1/181; F04D 29/605; F04D 1/063; F04D 13/12; F04D 29/528; F04D 29/026
See application file for complete search history.

(56) References Cited

U.S. PATENT DOCUMENTS

| | | | | |
|---|---|---|---|---|
| 2017/0049009 | A1* | 2/2017 | Steinke | H05K 7/20736 |
| 2017/0290202 | A1* | 10/2017 | Shah | G06F 1/1632 |
| 2023/0225076 | A1* | 7/2023 | Shah | H05K 7/20272 361/679.53 |

OTHER PUBLICATIONS

TW Search Report for Application No. 112139361 mailed Jul. 15, 2024, w/ First Office Action, 1 p.

* cited by examiner

LIQUID COOLING RACK ASSEMBLY FOR COMPUTING SYSTEM AND TELECOMMUNICATION SYSTEM INCLUDING THE SAME

CROSS-REFERENCE TO RELATED APPLICATIONS

This application claims priority from and benefit of U.S. Provisional Patent Application Ser. No. 63/515,771, filed on Jul. 26, 2023, titled "LIQUID COOLING RACK CDU DESIGN WITH EASY SERVICE REDUNDANT PUMP," which is hereby incorporated by reference herein in its entirety.

FIELD OF THE INVENTION

The present invention relates generally to a liquid cooling rack assembly for a computing system, and more specifically, to a liquid cooling rack assembly including a cabinet rack having a plurality of movable trays, each tray of the plurality of movable trays being movable generally horizontally and independently of other trays of the plurality of movable trays.

BACKGROUND OF THE INVENTION

In general, components of servers and network switches at a data center generate a tremendous amount of heat. For example, heat is dissipated through cooling fins, heat-conducting copper tubes or fans arranged in the server and the network switch. In addition to the traditional heat dissipation methods using air heat convection, a liquid cooling technology is also used by employing a multiple removable pump coolant monitoring cabinet design. For example, pumps can be used to directly provide cooling liquid to multiple groups of server cabinets for heat dissipation. However, when servicing the pumps, operation of the servers and network switches can be interrupted.

Therefore, a need exists for solving the problem of the operation being interrupted when an individual pump needs to be serviced. A need also exists for providing an easy and convenient mechanism to service a pump independently of other pumps without interrupting functions of the servers and network switches.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a liquid cooling rack assembly for a computing system is disclosed. According to various embodiments, the liquid cooling rack assembly includes a first cabinet rack configured to receive within a plurality of computing devices with heat-generating electronic components; a second cabinet rack configured to receive coolant components, the second cabinet rack having a plurality of movable trays; and a plurality of cooling pumps. Each tray of the plurality of movable trays is movable generally horizontally and independently of other trays of the plurality of movable trays. Each pump of the plurality of cooling pumps is placed on a respective one of the plurality of movable trays. Each pump is independently serviceable from other pumps of the plurality of cooling pumps based on independent movement of a respective tray.

In various embodiments, a pump inlet of each pump and a corresponding outlet pipeline are connected via a rubber expansion joint flange. In various embodiments, the pump inlet and the outlet pipeline unit are coupled by a clamp. In various embodiments, the rubber expansion joint flange is configured to absorb or isolate vibration generated by the pump.

In various embodiments, each tray of the plurality of movable trays includes at least one vibration absorber. In various embodiments, the at least one vibration absorber includes a pair of vibration absorbers placed in parallel on the movable tray. In various embodiments, a respective one of the plurality of cooling pumps is placed on the pair of vibration absorbers.

In various embodiments, the plurality of movable trays is arranged in a vertical direction. In various embodiments, each pump of the plurality of cooling pumps is configured to be separated from other coolant components when a respective one of the plurality of movable trays is pulled out of the second cabinet in a horizontal direction.

In various embodiments, a first flange of the pump and a corresponding second flange joined by a fastener is configured to be decoupled by loosening of the fastener, and the first flange is configured to be separated from the second flange in response to pulling out of the movable tray. In various embodiments, coolant leakage is prevented by a ball valve when the first flange is separated from the second flange. In various embodiments, the first flange is configured to be generally aligned with the second flange when the pulled out movable tray having the respective one of the plurality of cooling pumps is returned to the second cabinet rack.

In various embodiments, each tray of the plurality of movable trays includes a roller configured to enhance sliding of the tray. In various embodiments, the second cabinet rack is designed to be placed next to the first cabinet rack, and a size of the second cabinet rack is same as or similar to a size of a single first cabinet rack.

In various embodiments, each of the plurality of cooling pumps is configured to provide coolant to a respective first cabinet rack to cool a respective one of the plurality of computing devices enclosed within the first cabinet rack. In various embodiments, a number of the plurality of cooling pumps enclosed within the second cabinet rack is 2, 3, or more than 3.

In various embodiments, the second cabinet rack includes a control box including a circuit breaker, the control box being placed on one of the plurality of movable trays. In various embodiments, the control box is connected to each of the plurality of cooling pumps via power cables and configured to provide power to the plurality of cooling pumps.

According to other aspects of the present disclosure, a telecommunication system is disclosed. According to various embodiments, the telecommunication system includes a first cabinet rack configured to receive within a plurality of computing devices with heat-generating electronic components and a second cabinet rack configured to receive coolant components. The second cabinet rack has a plurality of movable trays, and each tray of the plurality of movable trays is movable generally horizontally and independently of other trays of the plurality of movable trays. The telecommunication system further includes a plurality of cooling pumps, each pump of the plurality of cooling pumps being placed on a respective one of the plurality of movable trays. Each pump is independently serviceable from other pumps of the plurality of pumps based on independent movement of a respective tray. Each pump of the plurality of cooling pumps is configured to provide coolant to a respective one of the plurality of computing devices within the first cabinet rack.

In various embodiments, the second cabinet rack further has a control box configured to provide power to the plurality of cooling pumps, the control box being placed on one of the plurality of movable trays.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1:
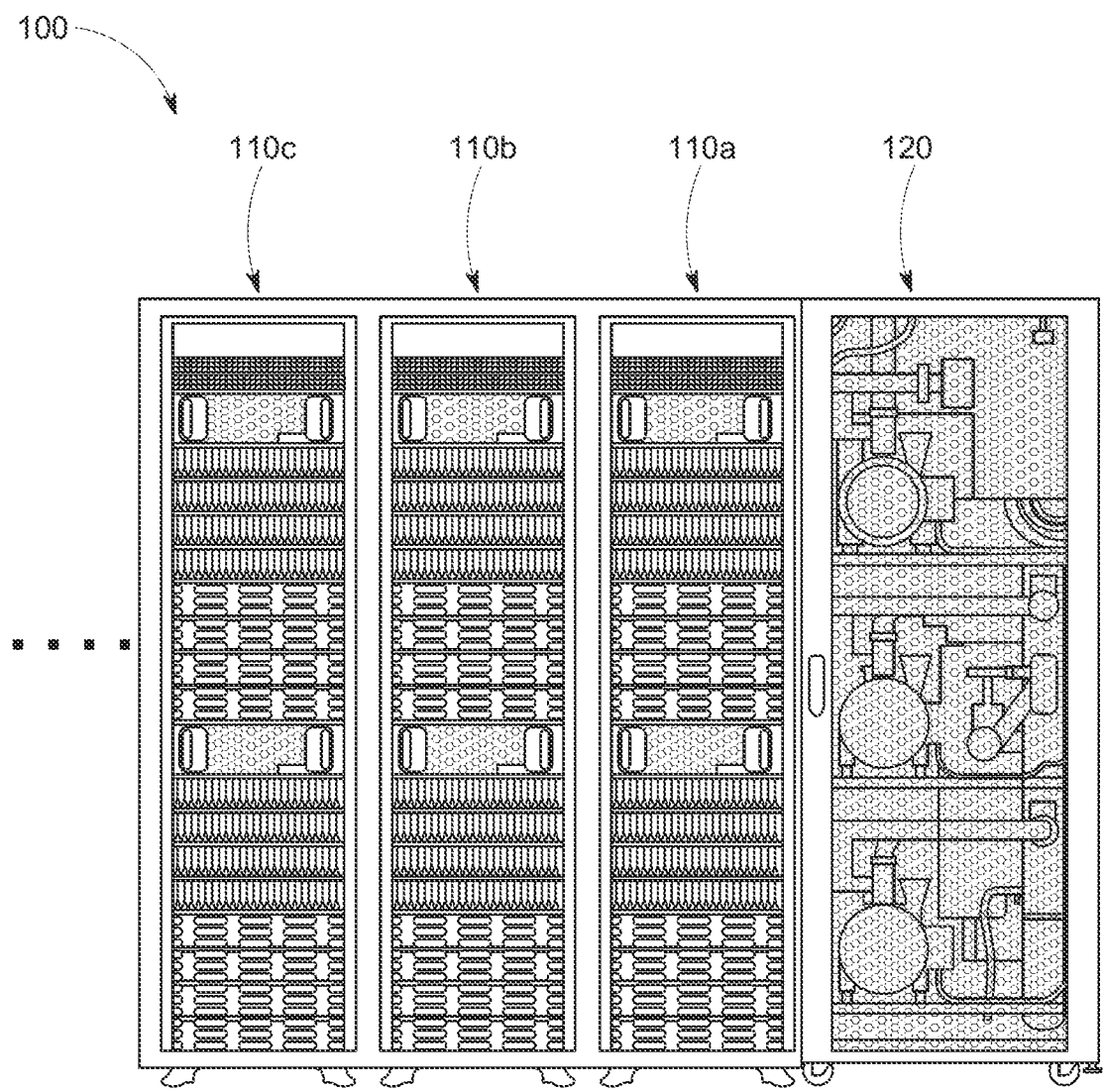
FIG. 1 shows a front view of a liquid cooling rack assembly, according to certain aspects of the present disclosure.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
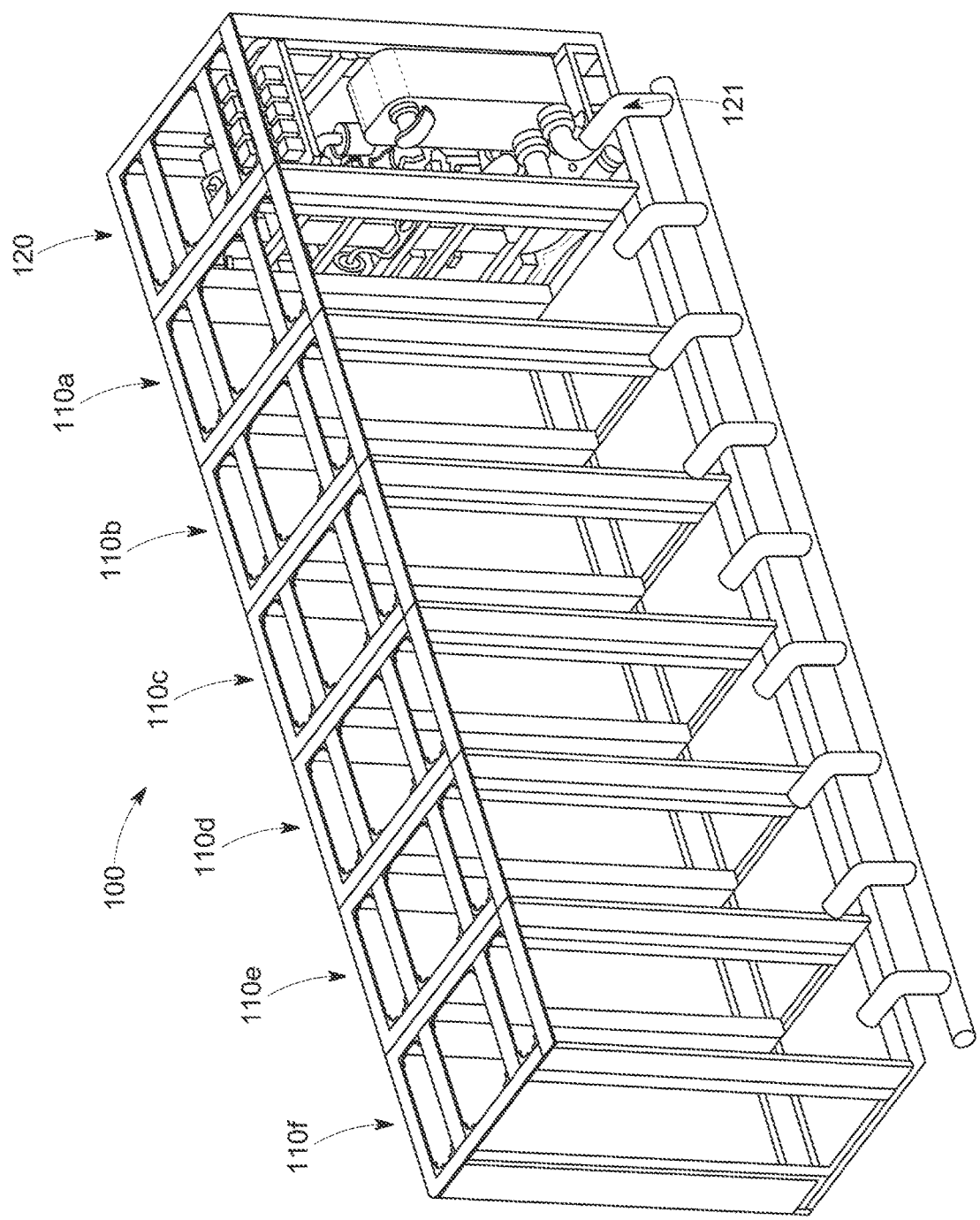
FIG. 2 shows a perspective rear view of a liquid cooling rack assembly, according to certain aspects of the present disclosure.

A liquid cooling rack assembly 100 for a computing system according to various embodiments of the present invention is shown in FIGS. 1 and 2. Referring to FIGS. 1 and 2, in various embodiments, the liquid cooling rack assembly 100 includes a first cabinet rack 110 (110*a*, 110*b*, 110c, . . . ) configured to receive within a plurality of computing devices with heat-generating electronic components. The liquid cooling rack assembly 100 further includes a second cabinet rack 120 configured to receive coolant components.

Referring to FIG. 2, in various embodiments, the second cabinet rack 120 is configured to provide coolant to each first cabinet rack 110a-110f via a pipeline 121 connected to the rear of the second cabinet rack 120.

Figure 3A:
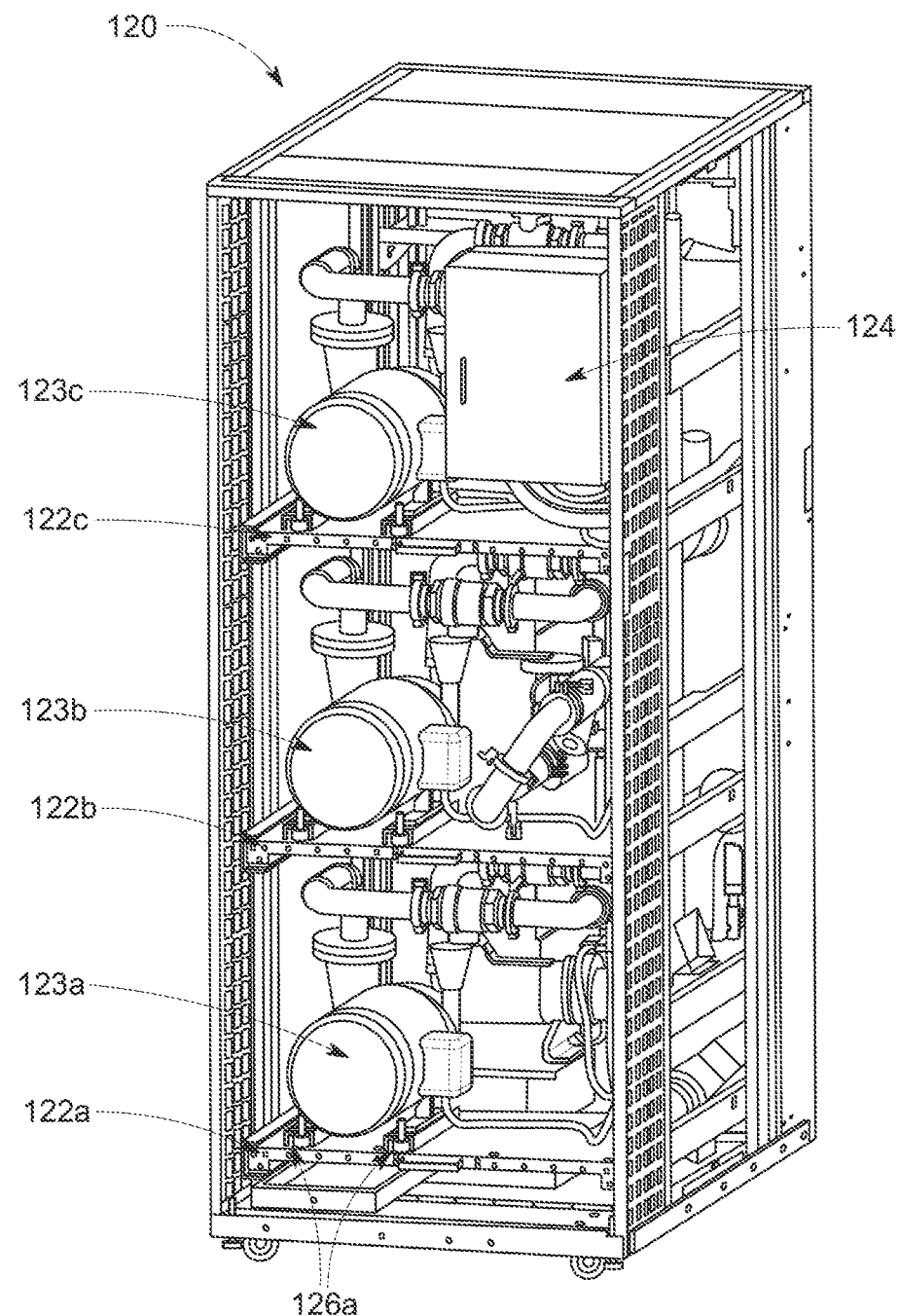
FIGS. 3A and 3B show a cabinet rack of a liquid cooling rack assembly configured to receive coolant components, according to certain aspects of the present disclosure.
Figure 3B:
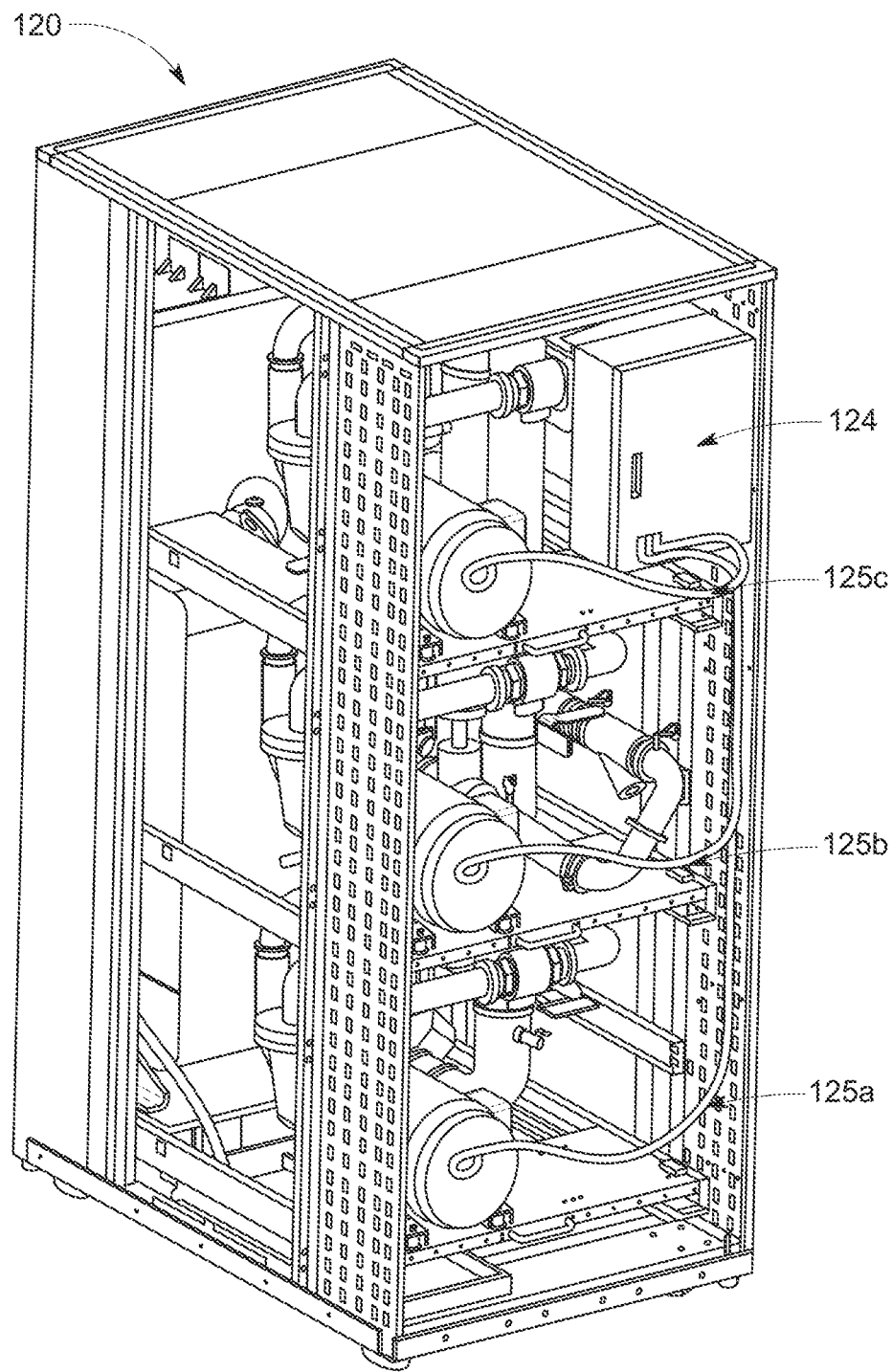

Referring to FIGS. 3A and 3B, in various embodiments, the second cabinet rack 120 has a plurality of movable trays 122 (122a, 122b, 122c). Although three movable trays 122 are shown in FIGS. 3A and 3B, the number of trays 122 is not limited to 3 and the number may be 2, 3, or more than 3. Each tray of the plurality of movable trays 122a, 122b, 122c (for example, only 122a as exemplified in FIG. 7) is movable generally horizontally and independently of other trays of the plurality of movable trays.

Referring to FIGS. 3A, 3B, 4, and 5, the liquid cooling rack assembly 100 further includes a plurality of cooling pumps 123 (123a, 123b, 123c). Each pump of the plurality of cooling pumps 123a, 123b, 123c is placed on a respective one of the plurality of movable trays 122a, 122b, 122c, respectively. As exemplified in FIG. 7, each pump 123a is independently serviceable from other pumps 123b, 123c of the plurality of cooling pumps based on independent movement of a respective tray 122a.

Referring to FIGS. 3A and 3B, the second cabinet rack 120 includes a control box 124 including a circuit breaker. The control box 124 is placed on one of the plurality of movable trays 122a, 122b, 122c. For example, the control box 124 is placed on the movable tray 122c. However, in some embodiments, the control box 124 is placed on another movable tray 122a or 122b. As exemplified in FIG. 3B, the control box 124 is connected to each of the plurality of cooling pumps 123a, 123b, 123c via power cables 125a, 125b, 125c, respectively. The control box 124 is configured to provide power to the plurality of cooling pumps 123a, 123b, 123c. The configuration and arrangement of the power cables 125a, 125b, 125c shown in FIG. 3B are merely exemplary and they may be configured and arranged differently.

Figure 4:
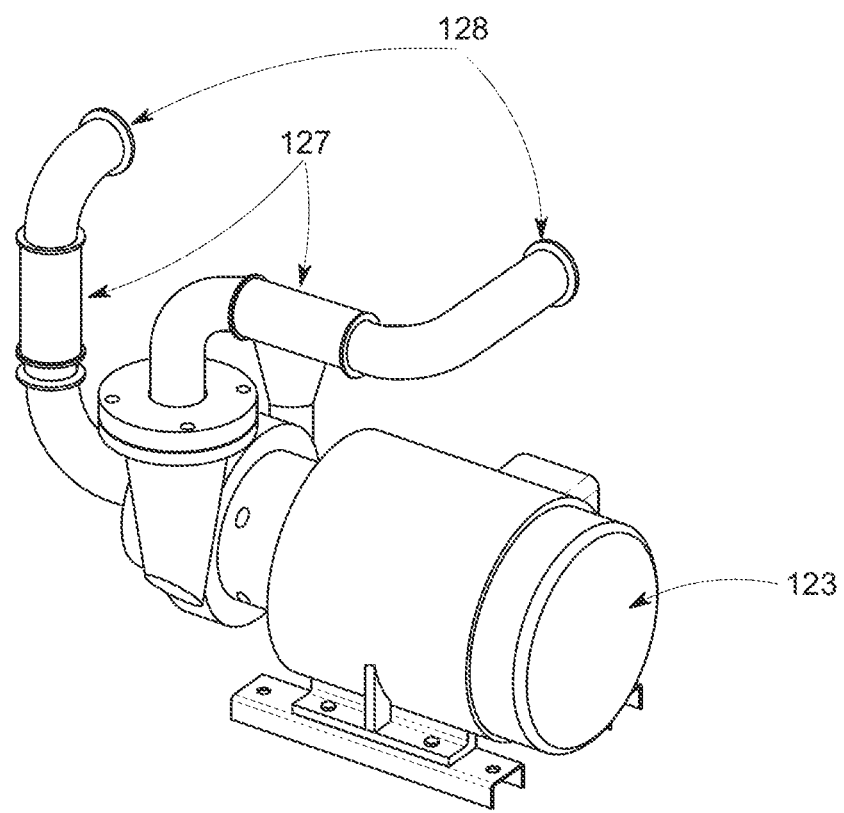
FIG. 4 shows an exemplary cooling pump and a flexible piping design, according to certain aspects of the present disclosure.
Figure 5:
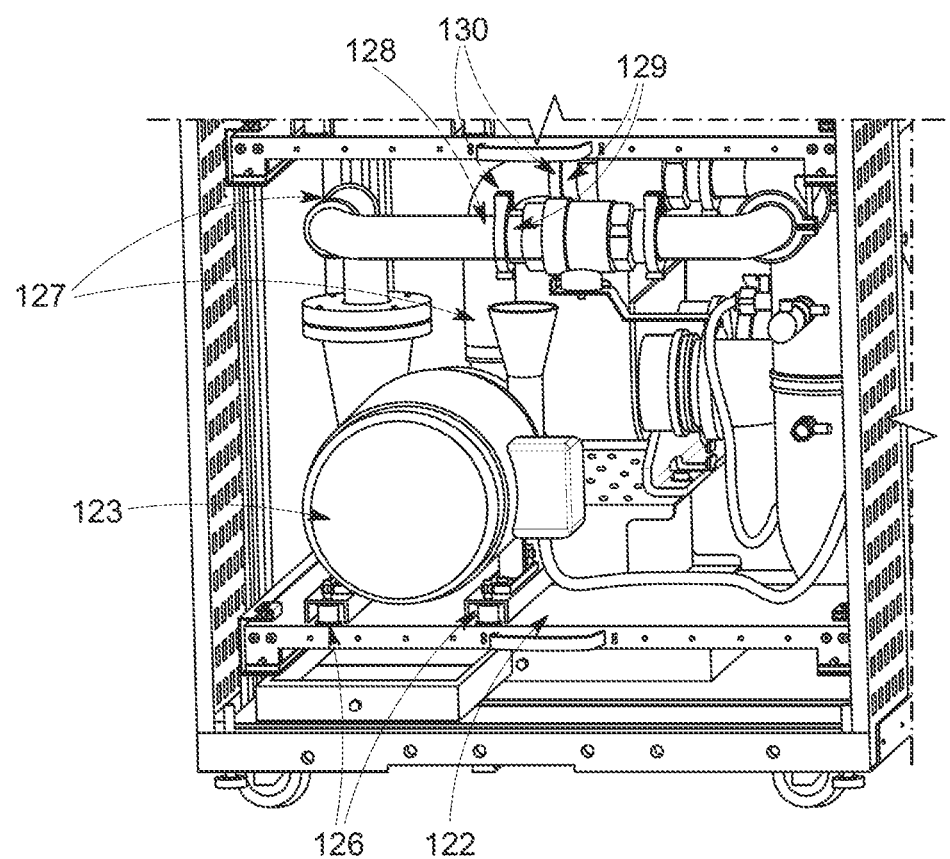
FIG. 5 shows a movable tray of a cabinet rack with a cooling pump placed thereon, according to certain aspects of the present disclosure.
Figure 6:
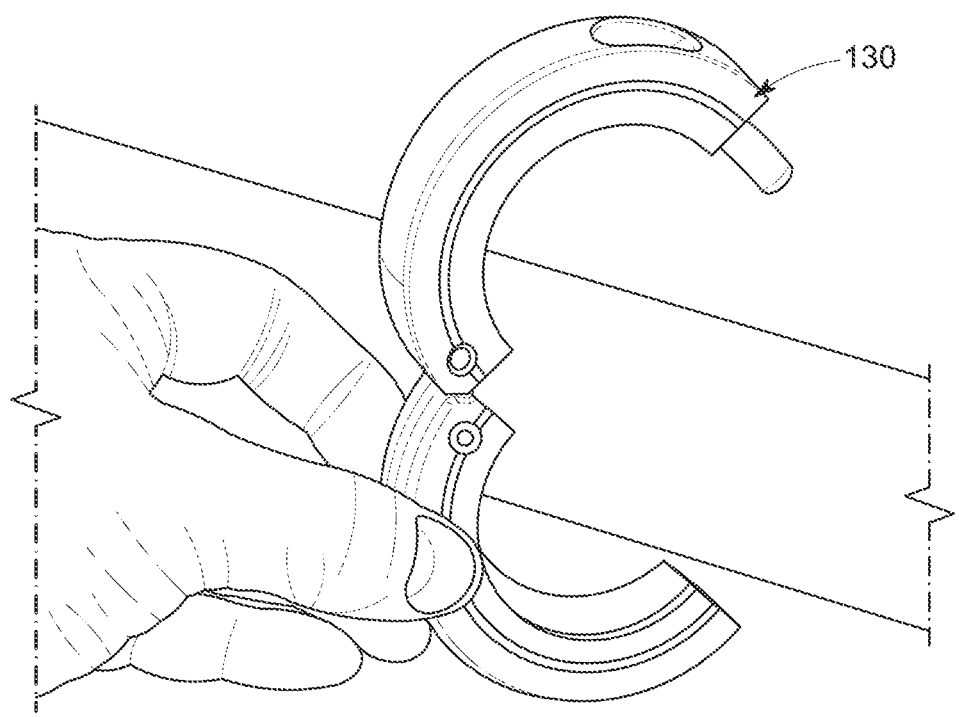
FIG. 6 shows an exemplary clamp used for coupling in a cabinet rack of a liquid cooling rack assembly, according to certain aspects of the present disclosure.

Referring to FIGS. 4 and 5, in various embodiments, a pump inlet of each pump 123 and a corresponding outlet pipeline are connected via a rubber expansion joint flange 127. In various embodiments, the pump inlet and the outlet pipeline unit are coupled by a clamp or clamps 130 exemplified in FIG. 6. In general, the size and/or weight of the pump 123 is great and the pump 123 needs to have an anti-vibration design. For example, the weight of the pump 123 may be 60 Kg or more. In some embodiments, the rubber expansion joint flange 127 is configured to absorb or isolate vibration generated by the pump 123.

Figure 7:
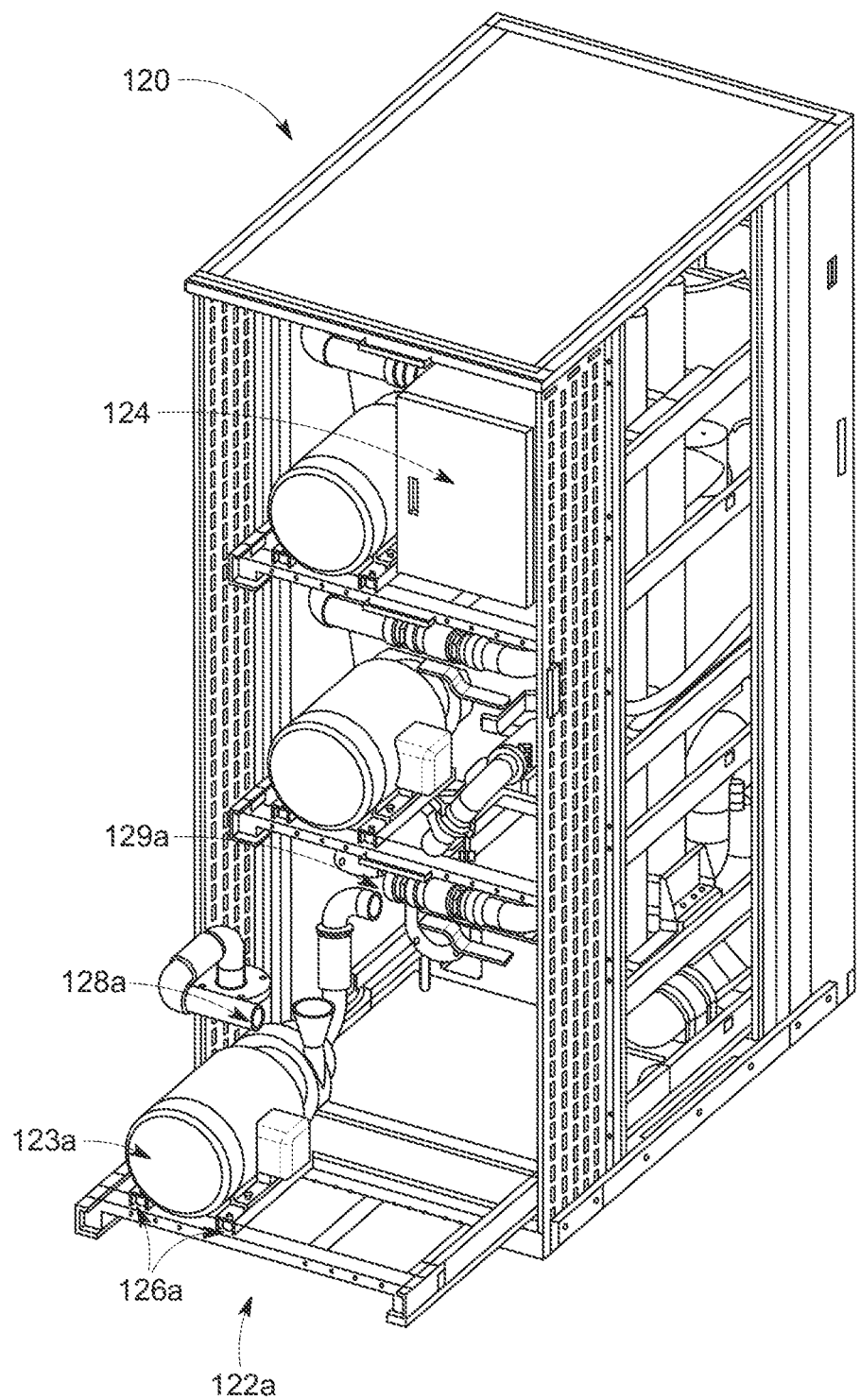
FIG. 7 shows a cabinet rack of a liquid cooling rack assembly having a plurality of movable trays, according to certain aspects of the present disclosure.

Further, referring to FIGS. 3A, 5, and 7, in various embodiments, each tray of the plurality of movable trays 122a, 122b, 122c includes at least one vibration absorber 126 (126a, 126b, 126c (126b, 126c not labeled in drawings)). In some embodiments, the at least one vibration absorber 126 includes a pair of vibration absorbers placed in parallel on the movable tray 122, as exemplified in FIG. 5. A respective one 123a of the plurality of cooling pumps 123 is placed on the pair of vibration absorbers 126.

As shown in FIGS. 3A, 3B, and 7, the plurality of movable trays 122a, 122b, 122c are arranged in a vertical direction. Referring to FIG. 7, the tray 122a is easily pulled out of the second cabinet rack 120 independently of other trays 122b, 122c. Therefore, the cooling pump 123a on the horizontally pulled out tray 122a can be serviced independently from other cooling pumps 123b, 123c.

Referring to FIG. 7, each pump of the plurality of cooling pumps 123a, 123b, 123c is configured to be separated from other coolant components when a respective one of the plurality of movable trays 122a, 122b, 122c is pulled out of the second cabinet rack 120 in a horizontal direction. For example, a first flange 128a of the pump 123a and a corresponding second flange 129a joined by a fastener or fasteners 130 (shown in FIGS. 5 and 6) are configured to be decoupled by loosening of the fastener 130, and the first flange 128a is configured to be separated from the second flange 129a in response to pulling out of the movable tray 122a. In some embodiments, coolant leakage is prevented by a ball valve when the first flange 128 is separated from the second flange 129.

In various embodiments, the first flange 128 is configured to be generally aligned with the second flange 129 when the pulled out movable tray 122a having the respective one 123a of the plurality of cooling pumps 123 is returned to the second cabinet rack 120. In some embodiments, each tray of the plurality of movable trays 122a 122b, 122c includes a roller configured to enhance sliding of the tray.

Referring back to FIGS. 1 and 2, the second cabinet rack 120 is designed to be placed next to the first cabinet rack 110. In various embodiments, a size of the second cabinet rack 120 is same as or similar to a size of a single first cabinet rack 110. Referring to FIG. 2, each of the plurality of cooling pumps 123a, 123b, 123c is configured to provide coolant to a respective first cabinet rack 110 to cool a respective one of the plurality of computing devices enclosed within the first cabinet rack 110. For example, a number of the plurality of cooling pumps 123 enclosed within the second cabinet rack 120 is 2, 3, or more than 3.

According to various embodiments of the present invention, a telecommunication system includes a first cabinet rack 110 configured to receive within a plurality of computing devices with heat-generating electronic components, as shown in FIGS. 1 and 2. The telecommunication system 100 further includes a second cabinet rack 120 configured to receive coolant components, as shown in FIGS. 1 and 2. The single second cabinet rack 120 has a plurality of movable trays 122a, 122b, 122c, as shown in FIGS. 3A and 3B. Each tray of the plurality of movable trays 122a, 122b, 122c is movable generally horizontally and independently of other trays of the plurality of movable trays, as shown in FIG. 7.

The single second cabinet rack 120 further has a plurality of cooling pumps 123a, 123b, 123c, as shown in FIGS. 3A and 3B. Each pump of the plurality of cooling pumps 123a, 123b, 123c is placed on a respective one of the plurality of movable trays 122a, 122b, 122c, as shown in FIGS. 3A and 3B. Each pump 123a/123b/123c is independently serviceable from other pumps of the plurality of pumps based on independent movement of a respective tray 122a/122b/122c, as exemplified in FIG. 7.

Referring to FIG. 2, each pump of the plurality of cooling pumps 123a, 123b, 123c is configured to provide coolant to a respective one of the plurality of computing devices within the first cabinet rack 110. Referring to FIG. 3B, the second cabinet rack 120 further has a control box 124 configured to provide power to the plurality of cooling pumps 123a, 123b, 123c. For example, the control box 124 is placed on one of the plurality of movable trays 122a, 122b, 122c, as shown in FIGS. 3A and 3B.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," an, and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A liquid cooling rack assembly for a computing system, the liquid cooling rack assembly comprising:
   a first cabinet rack configured to receive within a plurality of computing devices with heat-generating electronic components;
   a second cabinet rack configured to receive coolant components, the second cabinet rack having a plurality of movable trays, each tray of the plurality of movable trays being movable generally horizontally and independently of other trays of the plurality of movable trays; and
   a plurality of cooling pumps, each pump of the plurality of cooling pumps being placed on a respective one of the plurality of movable trays, each pump being independently serviceable from other pumps of the plurality of cooling pumps based on independent movement of a respective tray.

2. The liquid cooling rack assembly of claim 1, wherein a pump inlet of each pump and a corresponding outlet pipeline are connected via a rubber expansion joint flange.

3. The liquid cooling rack assembly of claim 2, wherein the pump inlet and the outlet pipeline unit are coupled by a clamp.

4. The liquid cooling rack assembly of claim 2, wherein the rubber expansion joint flange is configured to absorb or isolate vibration generated by the pump.

5. The liquid cooling rack assembly of claim 1, wherein each tray of the plurality of movable trays includes at least one vibration absorber.

6. The liquid cooling rack assembly of claim 5, wherein the at least one vibration absorber includes a pair of vibration absorbers placed in parallel on the movable tray.

7. The liquid cooling rack assembly of claim 6, wherein a respective one of the plurality of cooling pumps is placed on the pair of vibration absorbers.

8. The liquid cooling rack assembly of claim 1, wherein the plurality of movable trays is arranged in a vertical direction.

9. The liquid cooling rack assembly of claim 1, wherein each pump of the plurality of cooling pumps is configured to be separated from other coolant components when a respective one of the plurality of movable trays is pulled out of the second cabinet rack in a horizontal direction.

10. The liquid cooling rack assembly of claim 9, wherein a first flange of the pump and a corresponding second flange joined by at least one or more fasteners are configured to be decoupled by loosening of the fastener, and the first flange is configured to be separated from the second flange in response to pulling out of the movable tray.

11. The liquid cooling rack assembly of claim 10, wherein coolant leakage is prevented by a ball valve when the first flange is separated from the second flange.

12. The liquid cooling rack assembly of claim 11, wherein the first flange is configured to be generally aligned with the second flange when the pulled out movable tray having the respective one of the plurality of cooling pumps is returned to the second cabinet rack.

13. The liquid cooling rack assembly of claim 1, wherein each tray of the plurality of movable trays includes a roller configured to enhance sliding of the tray.

14. The liquid cooling rack assembly of claim 1, wherein the second cabinet rack is designed to be placed next to the first cabinet rack, and a size of the second cabinet rack is same as or similar to a size of a single first cabinet rack.

15. The liquid cooling rack assembly of claim 14, wherein each of the plurality of cooling pumps is configured to provide coolant to a respective first cabinet rack to cool a respective one of the plurality of computing devices enclosed within the first cabinet rack.

16. The liquid cooling rack assembly of claim 15, wherein a number of the plurality of cooling pumps enclosed within the second cabinet rack is 2, 3, or more than 3.

17. The liquid cooling rack assembly of claim 16, wherein the second cabinet rack includes a control box including a circuit breaker, the control box being placed on one of the plurality of movable trays.

18. The liquid cooling rack assembly of claim 17, wherein the control box is connected to each of the plurality of cooling pumps via power cables and configured to provide power to the plurality of cooling pumps.

19. A telecommunication system comprising:
   a first cabinet rack configured to receive within a plurality of computing devices with heat-generating electronic components;
   a second cabinet rack configured to receive coolant components, the second cabinet rack having a plurality of movable trays, each tray of the plurality of movable trays being movable generally horizontally and independently of other trays of the plurality of movable trays; and
   a plurality of cooling pumps, each pump of the plurality of cooling pumps being placed on a respective one of the plurality of movable trays, each pump being independently serviceable from other pumps of the plurality of pumps based on independent movement of a respective tray, wherein each pump of the plurality of cooling pumps is configured to provide coolant to a respective one of the plurality of computing devices within the first cabinet rack.

20. The telecommunication system of claim 19, wherein the second cabinet rack further has a control box configured to provide power to the plurality of cooling pumps, the control box being placed on one of the plurality of movable trays.

* * * * *